United States Patent
Pollachek (10) Patent No.: US 8,654,600 B1
(45) Date of Patent: Feb. 18, 2014

(54) LOW-VOLTAGE CURRENT SENSE AMPLIFIER

(75) Inventor: Robert Gary Pollachek, Vancouver, WA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 487 days.

(21) Appl. No.: 13/037,703

(22) Filed: Mar. 1, 2011

(51) Int. Cl.
G11C 7/02 (2006.01)
G11C 7/00 (2006.01)

(52) U.S. Cl.
USPC ................. 365/207; 365/189.09; 365/189.11

(58) Field of Classification Search
USPC ............. 365/189.09, 189.06, 189.08, 189.11, 365/189.12, 205, 207
See application file for complete search history.

(56) References Cited

U.S. PATENT DOCUMENTS

| | | | |
|---|---|---|---|
| 5,162,679 A | 11/1992 | Shen et al. |
| 5,189,322 A | 2/1993 | Chan et al. |
| 5,394,037 A | 2/1995 | Josephson et al. |
| 5,410,268 A | 4/1995 | Sharpe-Geisler |
| 5,418,482 A | 5/1995 | Wong et al. |
| 5,568,066 A | 10/1996 | Sharpe-Geisler et al. |
| 5,734,275 A | 3/1998 | Ashmore, Jr. |
| 6,414,521 B1 | 7/2002 | Potter et al. |
| 7,068,556 B2 | 6/2006 | De La Cruz et al. |
| 7,082,058 B2 | 7/2006 | Lee et al. |
| 7,102,934 B1 | 9/2006 | Cruz et al. |
| 7,177,207 B1 | 2/2007 | Vernenker et al. |
| 7,508,716 B2 | 3/2009 | Pasotti et al. |
| 7,830,101 B2 | 11/2010 | Parikh |
| 2008/0192555 A1* | 8/2008 | Fort ............................... 365/207 |
| 2010/0008159 A1* | 1/2010 | Fort et al. ................. 365/189.07 |

FOREIGN PATENT DOCUMENTS

WO   WO 2004/077439 A2   9/2004

OTHER PUBLICATIONS

"A Channel-Erasing 1.8-V-Only 32-Mb NOR Flash EEPROM with a Bitline Direct Sensing Scheme," by Shigeru Atsumi et al., IEEE Journal of Solid-State Circuits, vol. 35, No. 11, Nov. 2000; pp. 1648-1654.

"A High-Performance Very Low-Voltage Current Sense Amplifier for Nonvolatile Memories," by Antonino Conte et al., IEEE Journal of Solid-State Circuits, vol. 40, No. 2, Feb. 2005; pp. 507-514.

* cited by examiner

Primary Examiner — Son Dinh
Assistant Examiner — Hien Nguyen (57) ABSTRACT

In one embodiment, an integrated programmable device has a plurality of current sense amplifiers for reading data from non-volatile memory and a reference generator that provides common bias reference voltages to the sense amplifiers. The sense amplifiers can read data from the non-volatile memory at low power supply voltage levels (e.g., 750 mV) relative to the nominal supply level (e.g., 1.2V). Each sense amplifier has a trans-impedance amplifier that converts a memory bit-line current into a voltage level indicative of whether a selected memory cell is programmed or erased. The trans-impedance amplifier has a current mirror with a high-threshold regeneration device that lowers the sense amplifier's range of operating voltages. Each sense amplifier also has a level-shifted inverter that further lowers the sense amplifier's operating voltage range. The reference generator generates a ground-referenced bias voltage that each sense amplifier or group of sense amplifiers converts into a local, supply-referenced bias voltage.

20 Claims, 10 Drawing Sheets

LOW-VOLTAGE CURRENT SENSE AMPLIFIER

TECHNICAL FIELD

The present invention relates to current sense amplifiers and, more specifically but not exclusively, to a current sense amplifier employed to read out the state of memory cells in a non-volatile memory.

BACKGROUND

This section introduces aspects that may help facilitate a better understanding of the invention. Accordingly, the statements of this section are to be read in this light and are not to be understood as admissions about what is prior art or what is not prior art.

A current sense amplifier is often employed in a non-volatile memory device, such as a flash memory, to read out the state of a memory cell from within a large array of such cells by comparing the amount of current flowing through the memory cell to a reference value.

In systems using programmable devices, such as programmable logic devices (PLDs) and/or field-programmable gate arrays (FPGAs), to monitor and/or control other system components, the programmable devices must be properly configured before they can start operating the other system components. Configuring a programmable device typically occurs by down-loading (reading) configuration data from non-volatile memory.

When a programmable device is initially turned on (i.e., powered up), a supply ramp-up phase occurs in which the power supply voltage (e.g., Vcc) of the programmable device increases over time from zero to its normal operating level (e.g., 1.2V). Providing a memory device that can operate at relatively low voltages (i.e., below the normal operating level) can enable the programmable device to be configured relatively quickly (i.e., before the power supply voltage reaches its normal operating level), thereby reducing the time that it takes for the programmable device to start operating. Unfortunately, typical flash memory technology imposes certain constraints that make this difficult to achieve.

Figure 1A:
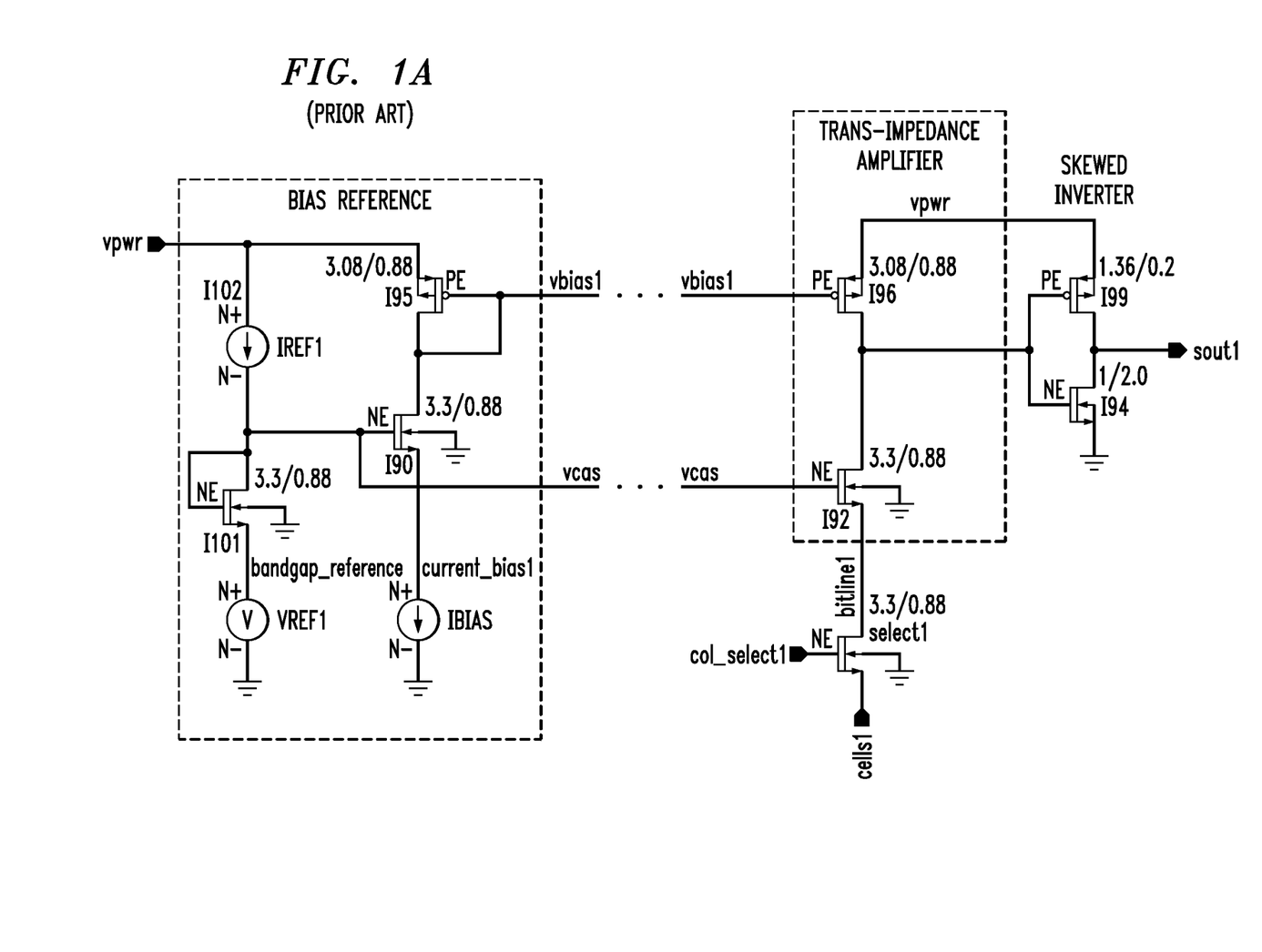
FIGS. 1(A)-(C) show schematic circuit diagrams of three different conventional configurations for sensing non-volatile memories.
Figure 1B:
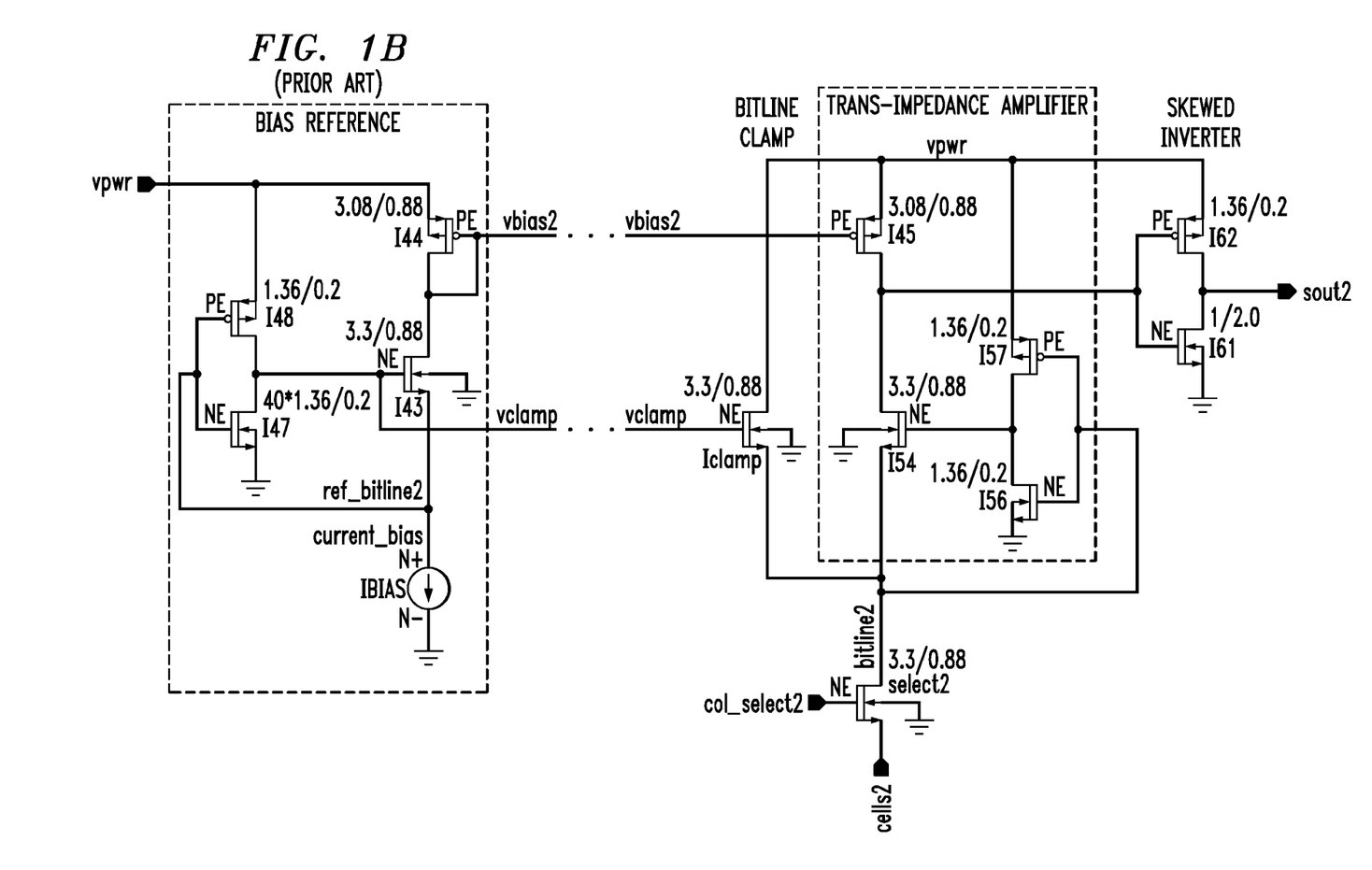
Figure 1C:
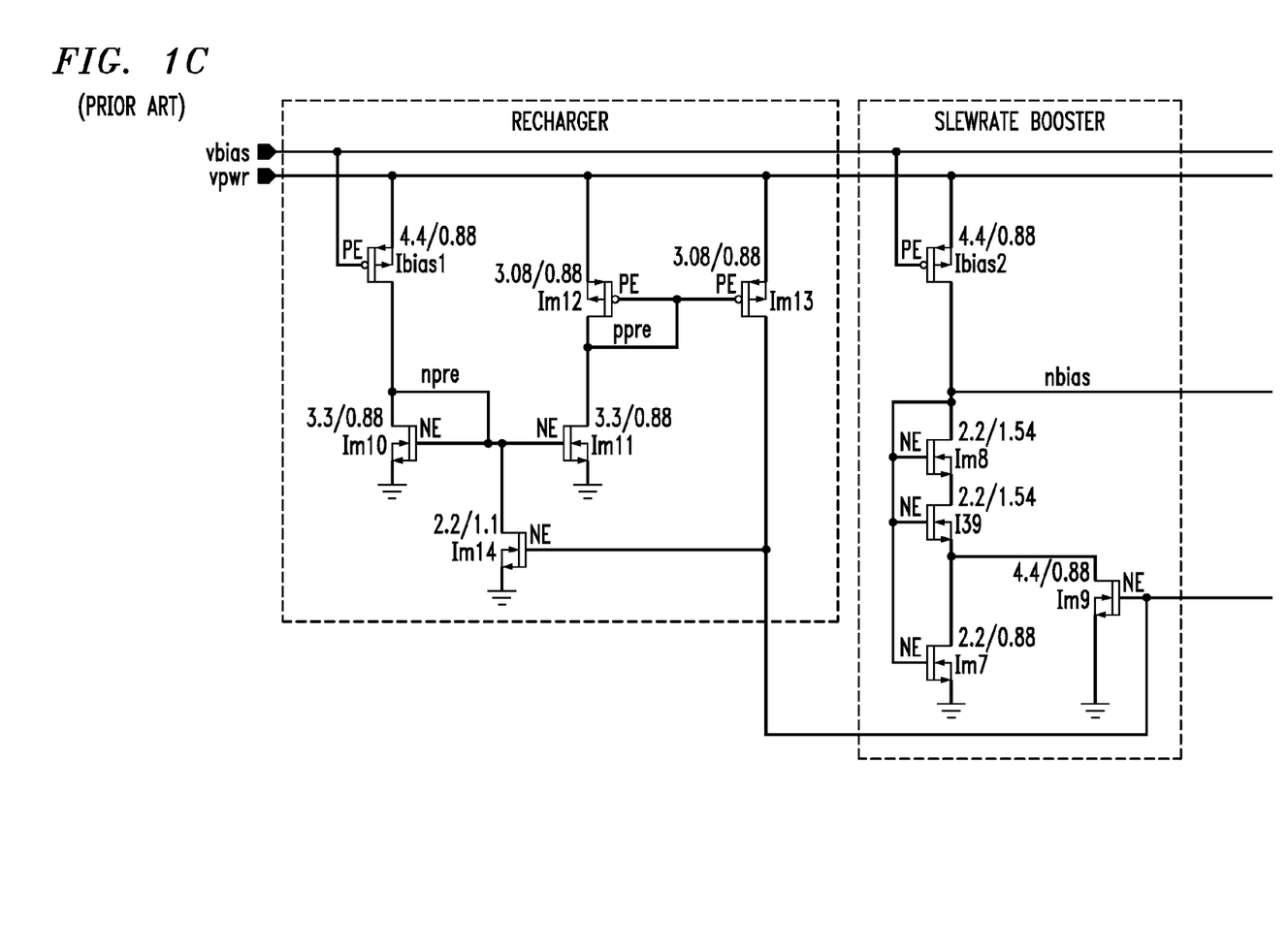

FIGS. 1(A)-(C) show schematic circuit diagrams of three different conventional configurations for sensing non-volatile memories. FIG. 1(A) shows a reference-biased trans-impedance sense amplifier, while FIG. 1(B) shows an inverter-biased trans-impedance sense amplifier. As shown in the figures, both of these configurations involve a bias reference generator and a trans-impedance amplifier employing a common-gate NMOS (N-type metal oxide semiconductor) transistor as the amplifying device (i.e., transistor i92 in FIG. 1(A) and transistor i54 in FIG. 1(B)). The transistor source serves as the input connection from a bit line of the memory array, and the transistor drain, via a skewed inverter, serves as the output of the amplifier (i.e., sout1 in FIG. 1(A) and sout2 in FIG. 1(B)). The drain is pulled to the positive power supply rail (i.e., vpwr in FIGS. 1(A) and 1(B)) through a fixed current source (i.e., transistor i96 in FIG. 1(A) and transistor i45 in FIG. 1(B)). These configurations pull a selected memory bit line toward a fixed voltage, while converting the bit-line current flow into a voltage output to drive a voltage detector (not shown) that determines whether the bit line corresponds to a logic 1 or a logic 0.

The configuration of FIG. 1(A) is small and power efficient and can maintain the memory cells at a fixed voltage that is largely independent of power supply voltage. The configuration of FIG. 1(B) provides higher gain and simpler reference generation, but uses more power and allows the memory cell voltage to vary with the power supply voltage (around the switch point of the feedback inverter formed by transistors i56 and i57), making it unsuitable for many flash technologies.

One significant problem with the prior-art configurations of FIGS. 1(A) and 1(B) is their requirement for substantial power supply voltage headroom to keep the analog trans-impedance amplifier stage biased, and to produce enough voltage swing for dependable conversion to digital levels. Examples of such configurations commonly require power supply voltage levels greater than 1.8V to operate properly. See, e.g., Shigeru Atsumi et al., "A Channel-Erasing 1.8-V-Only 32-Mb NOR Flash EEPROM with a Bitline Direct Sensing Scheme," IEEE Journal of Solid-State Circuits, Vol. 35, No. 11, November 2000, the teachings of which are incorporated herein by reference.

The configuration of FIG. 1(C), which is presented by Antonino Conte et al., "A High-Performance Very Low-Voltage Current Sense Amplifier for Nonvolatile Memories," IEEE Journal of Solid-State Circuits, Vol. 40, No. 2, February 2005, the teachings of which are incorporated herein by reference, can achieve operation at a 1V power supply level. This configuration uses differential current-mode sensing and a folded-cascode amplifier to keep voltage swings small. It employs multiple re-charge boosting circuits to improve access time. However, it allows memory cell voltage to vary in direct proportion to transistor thresholds, reducing its suitability for tightly constrained flash technologies. Furthermore, its relatively large area and relatively high current consumption make it impractical for applications requiring a large number of sense amplifiers at low cost and low power.

SUMMARY

In one embodiment, the present invention is an integrated circuit having a current sense amplifier comprising a trans-impedance amplifier, an inverter, and an output buffer. The trans-impedance amplifier receives an input current signal and generates a first voltage signal based on the input current signal. The inverter converts the first voltage signal into an inverted voltage signal, The output buffer converts the inverted voltage signal into an output voltage signal. The trans-impedance amplifier comprises a current mirror that generates a bias current for a conversion device that converts the input current signal into the first voltage signal. The current mirror comprises (i) a current source that generates a reference current, (ii) a mirror device connected to the current source to generate the bias current by mirroring the reference current, and (iii) a regenerative device connected between a drain of the current source and gates of the current source and the mirror device, wherein the regenerative device has a threshold voltage larger than a threshold voltage of the current source.

In another embodiment, the present invention is an integrated circuit having a current sense amplifier comprising a trans-impedance amplifier, a level-shifted inverter, and an output buffer. The trans-impedance amplifier receives an input current signal and generates a first voltage signal based on the input current signal, wherein the trans-impedance amplifier has a switching range that varies with supply voltage. The level-shifted inverter converts the first voltage signal in a first voltage domain into an inverted voltage signal in a second voltage domain, different from the first voltage domain, wherein the level-shifted inverter has a voltage switch point that tracks the switching range of the trans-impedance amplifier. The output buffer converts the inverted voltage signal into an output voltage signal.

In yet another embodiment, the present invention is an integrated circuit comprising at least one current sense amplifier and a reference generator that generates a bias voltage reference for the at least one current sense amplifier. The bias voltage reference is referenced to a ground voltage reference. The at least one current sense amplifier comprises local bias circuitry that generates, based on the bias voltage reference, a local bias voltage reference that is referenced to a power supply voltage. The at least one current sense amplifier comprises a trans-impedance amplifier that converts an input current signal into a first voltage signal based on the local bias voltage reference.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 2:
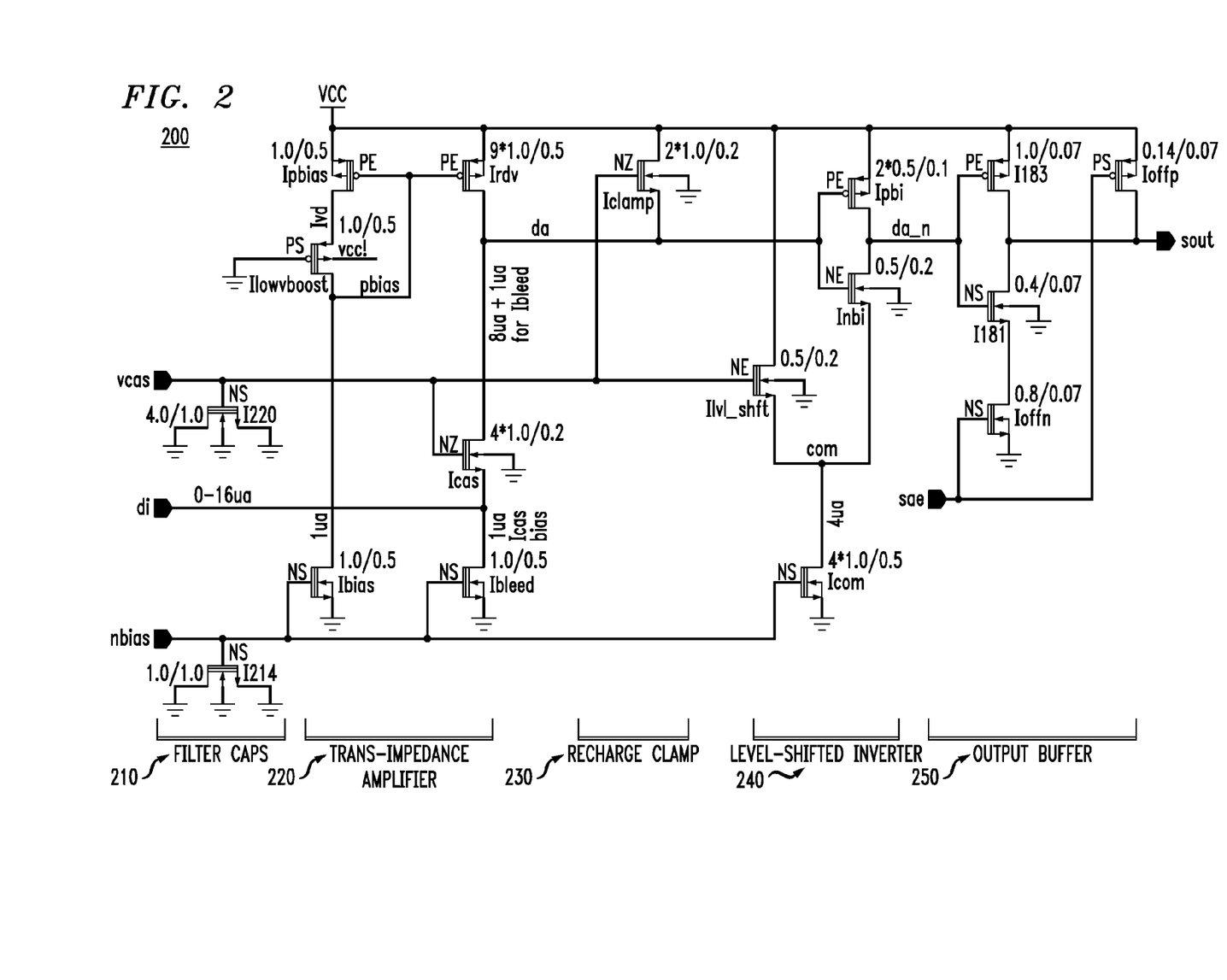
FIG. 2 shows a schematic circuit diagram of a current sense amplifier according to one embodiment of the present invention.

FIG. 2 shows a schematic circuit diagram of a current sense amplifier 200 according to one embodiment of the present invention. In certain implementations, current sense amplifier 200 is operable at power supply voltage levels below 1V, while still exhibiting excellent characteristics in terms of size, power, speed, and noise immunity.

Figure 3A:
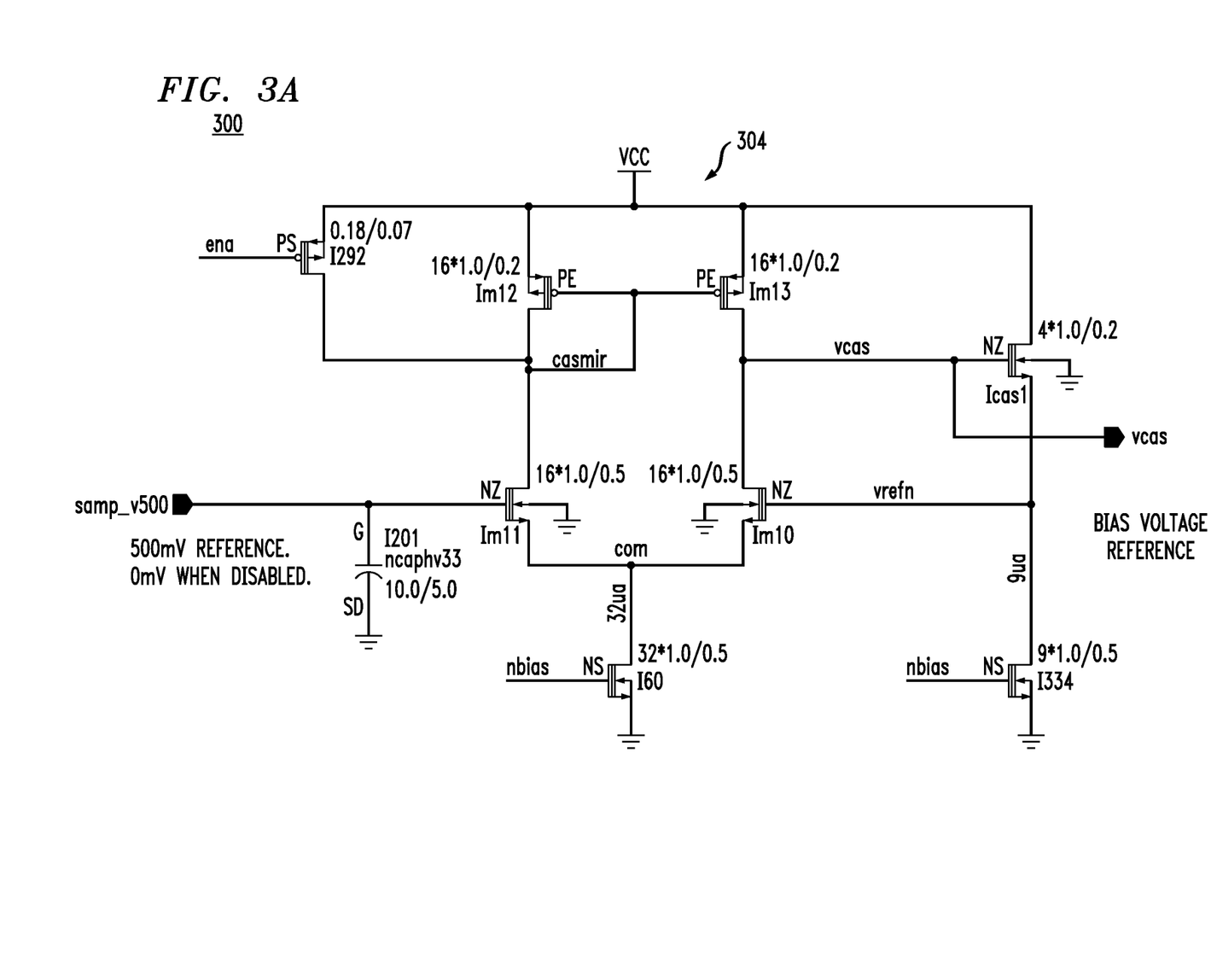
FIG. 3 shows a schematic circuit diagram of a bias reference generator that can be used to generate the DC reference voltages (i.e., nbias and vcas) and the control signal (i.e., sae) for a number of different instances of the current sense amplifier of FIG. 2 that support an array of memory cells in a non-volatile (e.g., flash) memory.
Figure 3B:
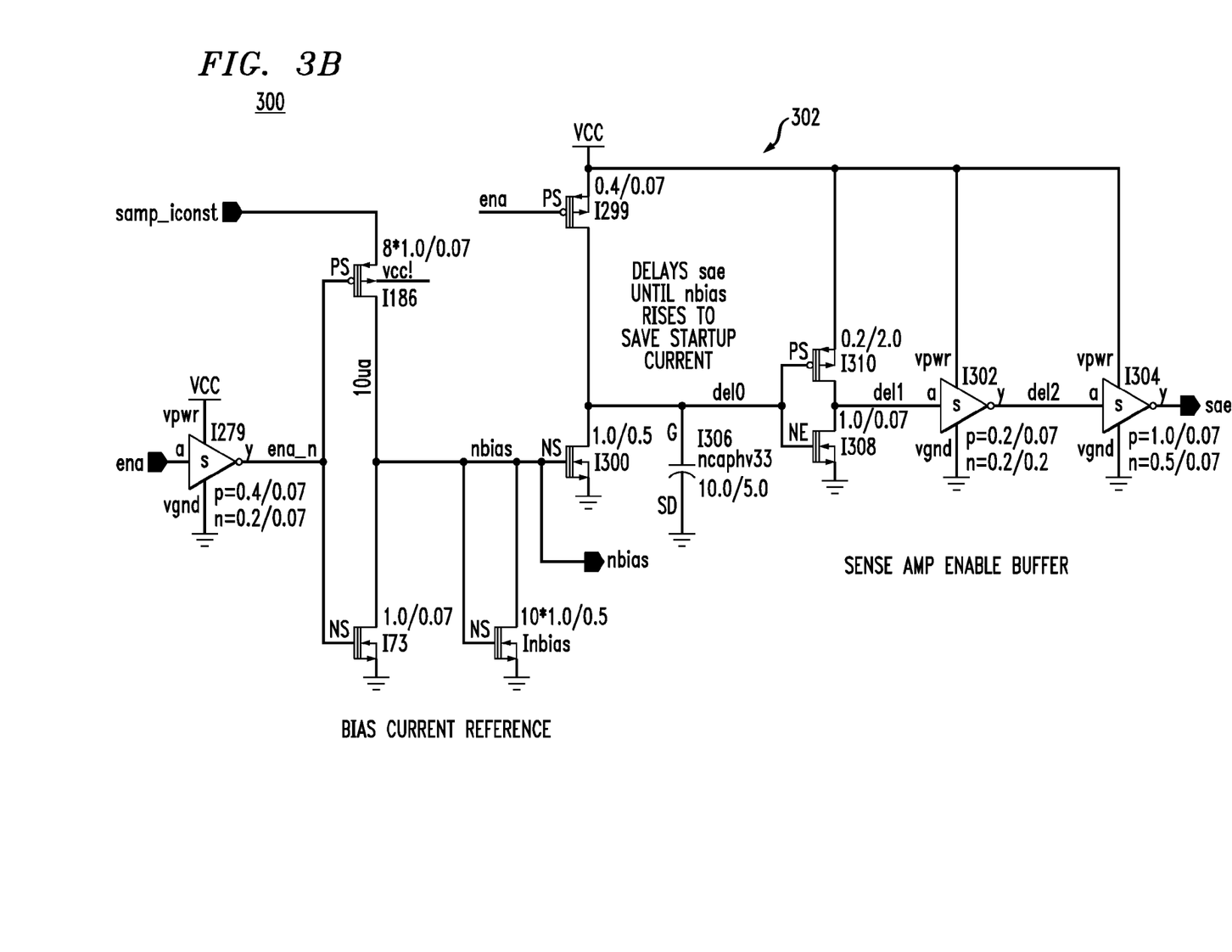

FIG. 3 shows a schematic circuit diagram of a bias reference generator 300 that can be used to generate the DC reference voltages (i.e., nbias and vcas) (FIG. 3A) and the control signal (i.e., sae) (FIG. 3B) for a number of different instances of current sense amplifier 200 of FIG. 2 that support an array of memory cells in a non-volatile (e.g., flash) memory. For example, in a 32-bit line array of memory cells having a different instance of current sense amplifier 200 configured to sense a different one of 32 bit lines in the array, a single instance of bias reference generator 300 can be used to provide common DC reference voltages and a common control signal to all 32 instances of current sense amplifier 200. In general, a single instance of bias reference generator 300 can drive hundreds of instances of current sense amplifier 200 since the generator is loaded only by the gate leakages of the amplifiers. Bias reference generator 300 will be further described later in this specification.

Note that, in FIGS. 2 and 3:
- Devices labeled PS or NS are standard-threshold P-type or N-type devices having standard performance characteristics;
- Devices labeled PE or NE are lower-threshold P-type or N-type devices having enhanced (i.e., faster) performance characteristics; and
- Devices labeled NZ are still lower-threshold N-type devices having even further enhanced (i.e., even faster) performance characteristics.

NZ devices may be native devices having no additional channel implant doping typically used to raise the device threshold level Vt.

As shown in FIG. 2, current sense amplifier 200 has five different stages: a filter capacitor stage 210, a trans-impedance amplifier stage 220, a recharge clamp stage 230, a level-shifted inverter stage 240, and an output buffer stage 250.

The filter capacitors in stage 210 suppress noise, resulting from switching activity in the current sense amplifier, from being fed back to the common signal lines for the DC reference voltages nbias and vcas.

In the trans-impedance amplifier of stage 220, trans-conductance gain is provided by the common-gate amplifier configuration of NMOS device Icas. The source terminal di of Icas connects to a corresponding bit line of the flash memory array through a conventional column decoder's transmission gate (not shown). The resulting, amplified drain voltage output da of Icas is pulled toward Vcc by a PMOS constant-current reference driver Irdv, whose saturation current (typically 5pa) is established by its width/length (W/L) proportionality to the DC bias current Ivd in PMOS mirror device Ibias. This current mirror is biased by typically 1 μa flowing through NMOS current sink Ibias. Ibias forms part of a current mirror whose counterpart (i.e., transistor Inbias) is located in reference generator 300 of FIG. 3B through the common gate connection nbias.

Referring again to FIG. 2, PMOS transistor Ilowvboost provides regenerative feedback to the current mirror formed by Irdv and Ipbias. Ilowvboost, which is implemented using a higher-threshold device than Ipbias, is placed between the gate and drain of Ipbias to provide a small amount of gate drive enhancement at low Vcc levels. In particular, as Vcc drops and approaches the threshold voltage Vt of Ilowvboost, the channel impedance due to |Vgs-Vt| of Ilowvboost (where Vgs is the gate-to-source voltage drop) rises more rapidly than that of the lower-threshold transistors that are used to implement the current mirror and biasing circuits (not shown) for the current mirror that generate the reference current at pin "samp_iconst" of FIG. 3B (e.g., a band-gap reference whose output current is relatively insensitive to Vcc). The more rapidly rising channel impedance of Ilowvboost increases the gate-to-source drive voltage Vgs across Ipbias as Vcc decreases, thereby compensating for the falling drain bias of the mirror devices as their drain-to-source voltages Vds decrease.

The width and length dimensions of Ilowvboost are set to a W/L value that provides just enough gate overdrive to Ipbias to counteract the drain conductance falloffs of Ibias and Irdv at low Vcc without excessive peaking. This extends the minimum Vcc level at which the bias current through trans-impedance amplifier 220 remains within its desired tolerance (typically 8 μa+/−10% supplied through input di).

Figure 4:
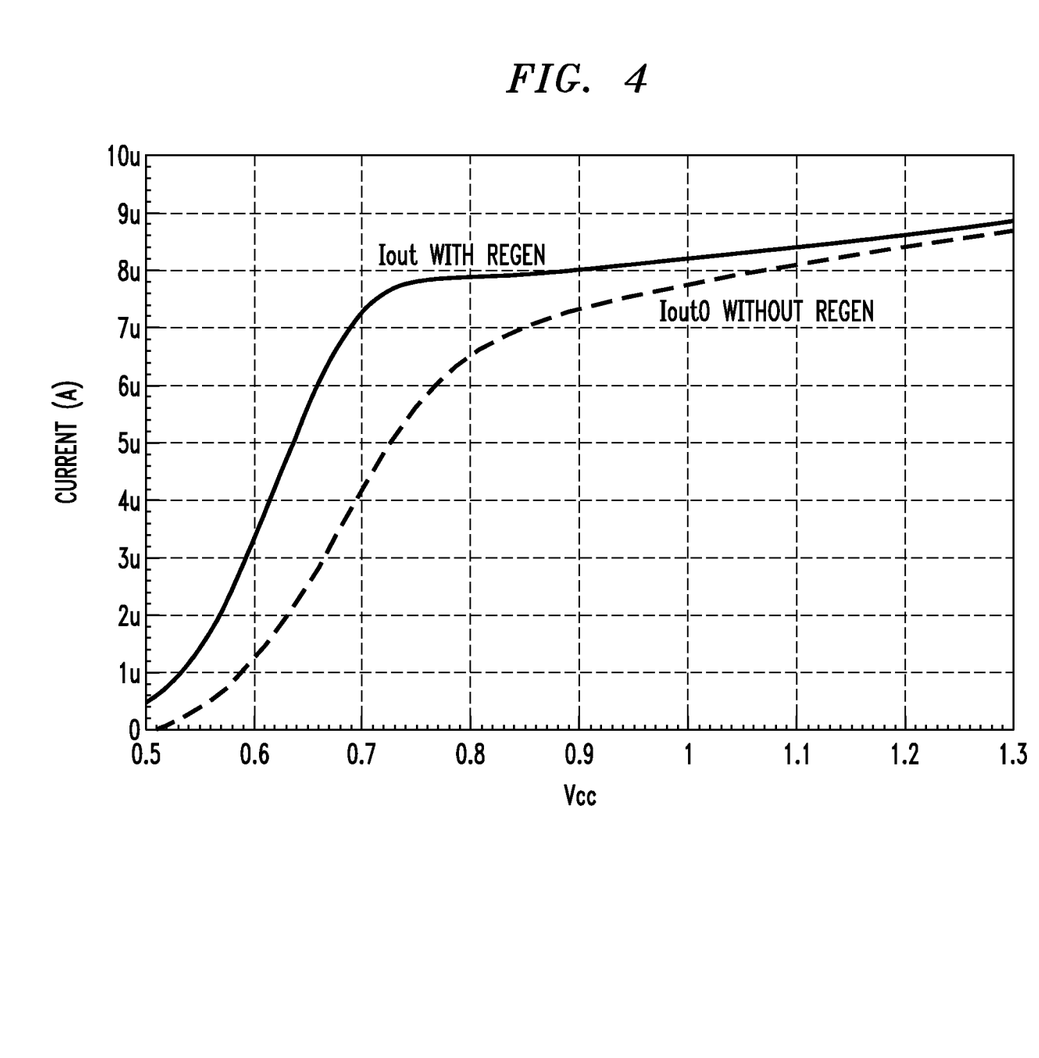
FIG. 4 graphically illustrates the roll-off performance of the current sense amplifier of FIG. 2 both with and without the regenerative feedback of Ilowvboost.

FIG. 4 graphically illustrates the roll-off performance of current sense amplifier 200 both with and without the regenerative feedback of Ilowvboost. In particular, FIG. 4 presents the output current Iout (i.e., the current through node da) as a function of Vcc from 0.5V to 1.3V. As shown in FIG. 4, without Ilowvboost, the output current Iout of a conventional current mirror drops out of tolerance when Vcc drops below about 850 mV. With Ilowvboost, adequate levels of output current Iout are maintained down to Vcc levels of about 750 mV.

Referring again to FIG. 2, input current passed through Icas to node di pulls up the flash memory bit line to approximately 500 mV, in opposition to current from the selected flash memory cell, which acts to pull down the flash array bit line toward Vss (e.g., ground). When the sum of the input current passed through node di and the 1 µa current in bleed device Ibleed equals the 9 µa current bias through Irdv, both Irdv and Icas enter their saturation regions, providing voltage gain on the output node da. This gain is proportional to the trans-conductance of Icas times the saturation-region drain impedance of Irdv in parallel with that of Icas.

The bit-line voltage target of 500 mV is established by reference generator 300, which sets the voltage on DC reference line vcas at 500 mV above the threshold of Icas. Icas is preferably implemented as a native NMOS transistor, which does not receive any threshold-increasing channel implants. Thus, a native NMOS device can provide a lower threshold (approximately 250 mV) without incurring any extra implant costs. Also, since Icas operates with 500 mV source-body bias, its body effect helps suppress sub-threshold leakage that would otherwise diminish the gate's control of channel current.

The NMOS device Ibleed acts to continuously bleed approximately 1 µa of channel current through Icas. This current keeps Icas in strong inversion even if the selected flash cell's bit-line current drops to 0, which can occur, for example, when the flash array's row or column decoder gets deactivated while addresses settle or when the selected flash cell has been programmed to a high threshold state. By preventing Icas from entering into its sub-threshold region, the bleed current prevents node di from rising much higher than 500 mV under such light-load conditions.

In recharge clamp stage 230, the NMOS device Iclamp accelerates ramp-up of the selected bit line when recovering from a previously discharged state, for faster access time. In the implementation of FIG. 2, Iclamp is implemented using transistors of the same channel length and type as those used to implement Icas. The combination of Iclamp in series with Icas acts as a source-follower to node vcas. The combination provides much more pull-up current than Irdv alone can provide whenever node da gets pulled lower than about 400 mV (i.e., vcas minus the threshold Vt of Iclamp).

Once the bit-line voltage at input di has ramped up to about 450 mV, node da will have ramped up to over 500 mV due to the 50 mV drain-to-source drop Vds across Icas. Iclamp begins to cut off as its drive |Vgs-Vt| approaches 0. The voltage gain through Icas causes node da to rise rapidly as input di reaches this point, where Icas enters saturation as its current approaches the drain saturation current Idsat of Irdv (e.g., 9 µa). This amplified rise of voltage da cuts off Iclamp completely. Irdv's 9 µa bias current minus Ibleed's 1 µa bias current then sets the current detection level (i.e., switch point) of current sense amplifier 200 to 8 µa.

Figure 5A:
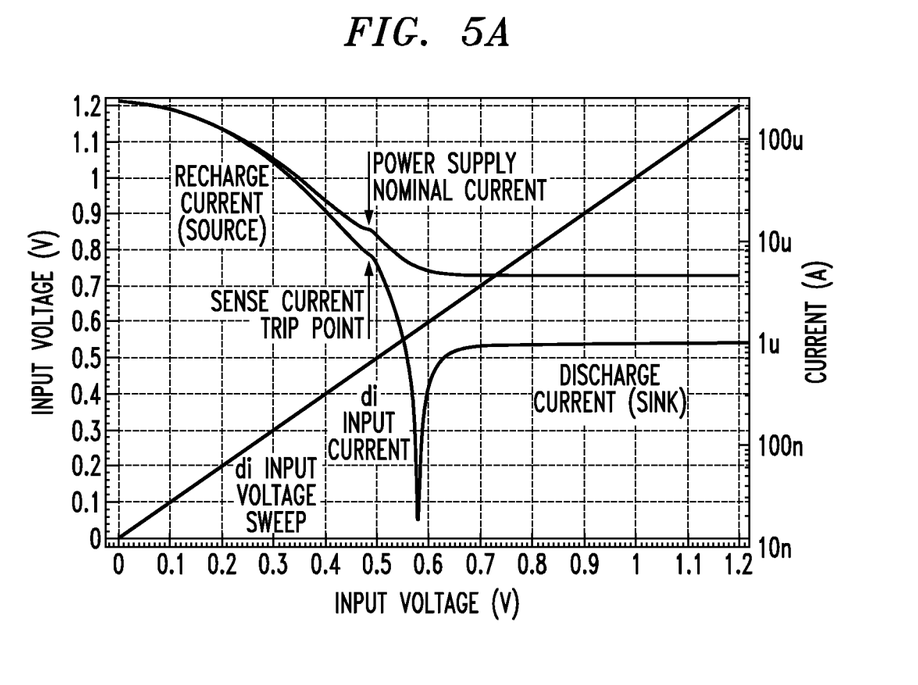
FIG. 5 graphically illustrates typical transfer characteristics of the trans-impedance amplifier of FIG. 2 operating at a nominal Vcc level of 1.2V, where the input voltage di is swept from 0 to Vcc.
Figure 5B:
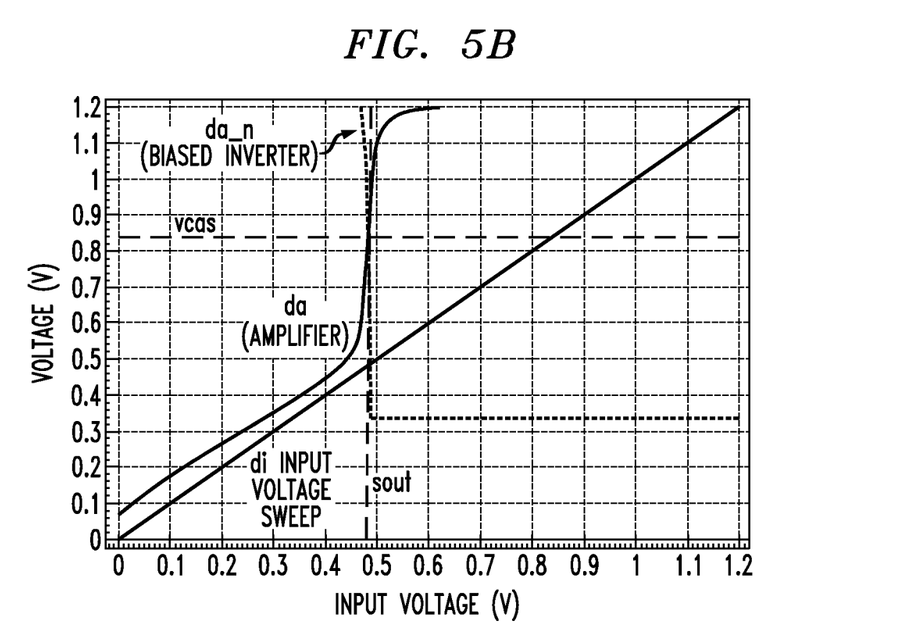

FIG. 5 graphically illustrates typical transfer characteristics of trans-impedance amplifier 220 of FIG. 2 operating at a nominal Vcc level of 1.2V, where the input voltage di is swept from 0 to Vcc. In particular, in FIG. 5(A), the upper curve shows power supply (Vcc) current, and the lower curve shows input current di, while FIG. 5(B) shows the trans-impedance amplifier output voltage da of FIG. 2 as a function of the input voltage di. Note that the input current through node di reaches its inflection point (i.e., where the di input current dips towards 0 in FIG. 5A) when the input voltage at node di reaches about 575 mV. This is the maximum voltage to which the sense amplifier pulls the flash bit line. As the di input current crosses the desired 8 µa detection level, which is the current that distinguishes a programmed from an erased flash cell, the trans-impedance amplifier output da switches (as indicated in FIG. 5B). This occurs as node di reaches about 475 mV. When the di voltage is pulled substantially below this switch point, Iclamp sources substantial current (e.g., up to 100µ) to quickly restore the bit-line voltage back up toward the switch point. If decoder leakage or remnant charge were to cause node di to exceed about 575 mV, Ibleed begins sinking current to restore the bit-line voltage back down to the desired range. This reduces voltage stress on the flash cells.

Referring again to FIG. 2, in level-shifted inverter 240, devices Icom and Ilvl_shift are connected in a series cascode configuration to raise the low supply side of the inverter formed by devices Inbi and Ipbi. Level-shifted inverter 240 acts as a CMOS inverter with an elevated ground reference. A conventional inverter switches when its input passes a relatively fixed fraction of (Vcc-Vss). That fraction is determined primarily by the ratio of the dimensions of the PMOS and NMOS transistors used to implement the inverter. In contrast, level-shifted inverter 240 has its low supply connected to node com, which is shifted above Vss by an offset that is established by the regulated reference voltage vcas minus the threshold voltage Vt of Ilvl_shift.

The voltage level at intermediate node com is biased by the DC current (e.g., about 4 µa) sunk through Icom. At this bias current, Ilvl_shft elevates the voltage at node com by typically 300 mV above Vss. The voltage at node com tracks the reference voltage vcas, just as does the 500 mV switch point established on node di by the relation (vcas minus the threshold of Icas). Since the thresholds of all large-channel NMOS transistors tend to track each other with process and temperature variation, the operating levels of nodes com and di tend to track together with process and temperature variation.

Note that the voltage on input di is the lowest voltage to which node da can switch when the bit-line current exceeds 8 µa, and Vcc is the highest voltage to which node da can switch, since Vcc is the highest level that Irdv can pull node da when the bit-line current is 0. As such, trans-impedance amplifier 200's saturated output switching range is between Vcc and the quantity (vcas minus the threshold of Icas).

The input switch point of level-shifted inverter 240 is a fixed fraction of (Vcc-com), where node com is at (vcas minus the threshold of Ilvl_shift). Therefore, level shifting the inverter ground produces a switch point that better tracks the switching range of the trans-impedance amplifier's output. This improved tracking lowers the minimum Vcc at which the two circuits remain within each other's switching range, extending the low-voltage operating range of this pair of stages by about 100 mV.

The output buffer stage 250 is a conventional NAND gate configuration. The output buffer's gain converts the level-shifted inverter's skewed output switch levels (between approximately 300 mV and Vcc) to full Vss-to-Vcc logic levels.

To disable current sense amplifier 200, inputs sae and nbias are held at Vss. Also, node di is disconnected from the flash bit lines by switching off the column transfer gates in the array (not shown). Depending on the implementation, bias input vcas can either float or be driven to a fixed voltage. Allowing node vcas to float typically minimizes gate leakage. The output buffer's NAND configuration prevents significant current flow when control signal sae is at Vss, so nodes da and da_n can be allowed to float.

When current sense amplifier 200 is enabled, its principle current consumption comes from the current it passes from Vcc to its input di. This current provides bias to the selected flash cell, and therefore varies (typically between 0 to 16 µa) with the programmed state of that flash cell. Other current consumption comes from the Ibias and Ibleed devices at about 1 µa each, plus 4 µa from Icom. So the typical DC current consumed by current sense amplifier 200 when active is only about 14 µa, assuming a 50% mix of programmed and erased flash cells. This compares with at least 76 µa for the current sense amplifier of FIG. 1(C). In one implementation, the size of current sense amplifier 200 is about 81 µm$^2$, compared to 600 µm$^2$ for the current sense amplifier of FIG. 1(C).

Referring again to bias reference generator 300, FIG. 3(B) shows the DC reference signal nbias produced by NMOS current mirror Inbias. The voltage level of node nbias is pulled upward by a regulated DC bias current samp_iconst supplying typically 10 µa in this example. This bias current may be supplied by a band-gap reference generator (not shown) or other suitable, stable current reference.

To disable reference generator 300 and each instance of current sense amplifier 200 that generator 300 controls, enable input ena of FIG. 3 is brought to Vss. In that case, the input bias current samp_iconst is disconnected by transistor 1186, and node nbias is grounded by transistor 173, turning off all current mirrors gated by nbias.

Bringing node ena to Vcc begins a delay timer 302 that enables the reference generator and current sense amplifiers after a preset delay. This non-critical delay is produced by delaying the rise of control signal sae, which is used to enable output buffer 250 of FIG. 2. The magnitude of the delay is set by the ratio of the capacitance of device 1306 to the current in device 1300, which mirrors nbias. This delay circuit detects that nbias has risen and provides additional time for both nbias and vcas to settle to their steady-state voltages. This, in turn, reduces startup (in-rush) current through the current sense amplifiers' output buffers until all analog circuitry has reached a stable bias point.

FIG. 3(A) shows the circuitry that generates bias reference vcas. Bias reference vcas is a DC voltage that is maintained at about 500 mV above the threshold of device Icas in the current sense amplifiers. This keeps the sense amplifiers' di inputs (i.e., array bit lines and flash cell drains) biased close to the optimal 400 mV-600 mV range set by flash technology constraints. This bias is implemented using a conventional current-mirror op-amp 304 composed of tail device 160, mirrors Im12 and Im13, input amplifiers Im10 and Im11, and turn-off device 1292.

Op-amp 304 compares a 500 mV reference voltage samp_v500 (supplied by a band-gap reference or other stable source (not shown)) to voltage vrefn. Voltage vrefn is the voltage at the source of transistor Icas1 that is gated by vcas, where transistor Icas1 is a replica of common-gate input transistor Icas of FIG. 2. Icas1 is biased by a 9 µa current by device 1334, which mirrors nbias, thereby replicating the bias current through Icas in current sense amplifier 200. This sets node vcas to a voltage that is a native-NMOS threshold above the desired 500 mV on the flash array's bit lines driven by the current sense amplifiers' di inputs.

Note that the voltage levels of nodes samp_v500, vcas, and nbias are all relative to Vss, and that Vss is normally connected to the chip's common substrate and ground plane. If a large number of instances of current sense amplifier 200 require long signal routing, then the nbias and vcas signal lines may be shielded by Vss to guard them from extraneous noise coupling. The decoupling (filter) capacitors in stage 210 of each current sense amplifier 200 stabilize the nbias and vcas voltages with respect to the local Vss (substrate) voltage at each current sense amplifier, such that wire resistance is not problematic. The small current mirror composed of Ibias, Ipbias, and Ilowvboost in each current sense amplifier 200 provides a local Vcc-referenced bias level (i.e., pbias) relative to the current sense amplifier's local Vcc voltage, derived from nbias, such that Vcc noise does not accumulate.

In an alternative embodiment of FIG. 2, multiple nearby instances of sense amplifier 200 may be connected to each other at node "pbias". This can reduce the variation of pbias voltage due to random parametric variations (thresholds, dimensions, gains) among mirror transistors Ipbias, Ilowvboost, and Ibias. This reduction in random variation comes from the larger effective channel area of the paralleled mirrors that now collectively generate pbias. Such interconnection of pbias does not change the operation of each sense amplifier, since the voltage and current produced at pbias is the same in each identical sense amplifier, whether or not they are connected to each other. For example, by connecting pbias of four instances together, random variation in pbias can be reduced by half, according to the well-established proportionality of MOSFET variability: $1/\sqrt{W*L}$. The number of sense amplifiers 200 that may share a common pbias connection should be chosen to be small enough so that resistance in the Vcc interconnect does not produce significant Vcc voltage differences due to I*R drop across the span of the shared sense amplifiers.

Figure 6A:
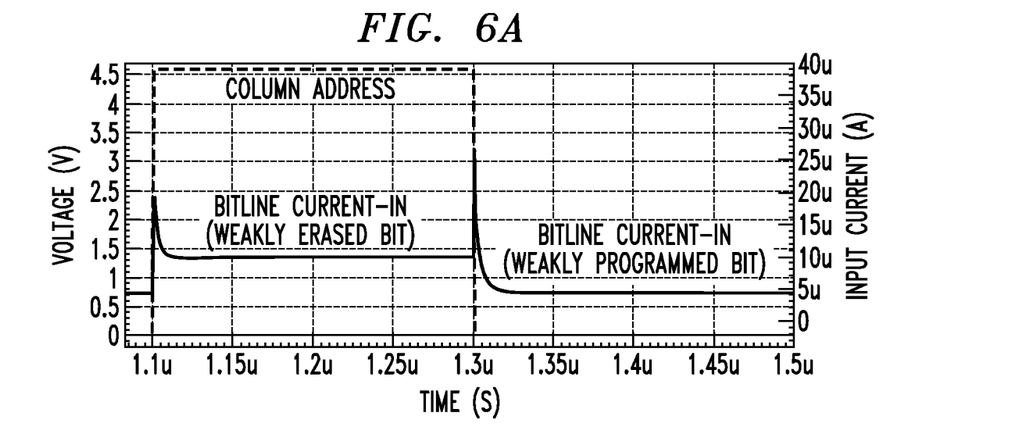
FIG. 6 graphically illustrates the simulated output transient response of the current sense amplifier of FIG. 2 at a very low Vcc of 0.75V in a typical 65 nm technology.
Figure 6B:
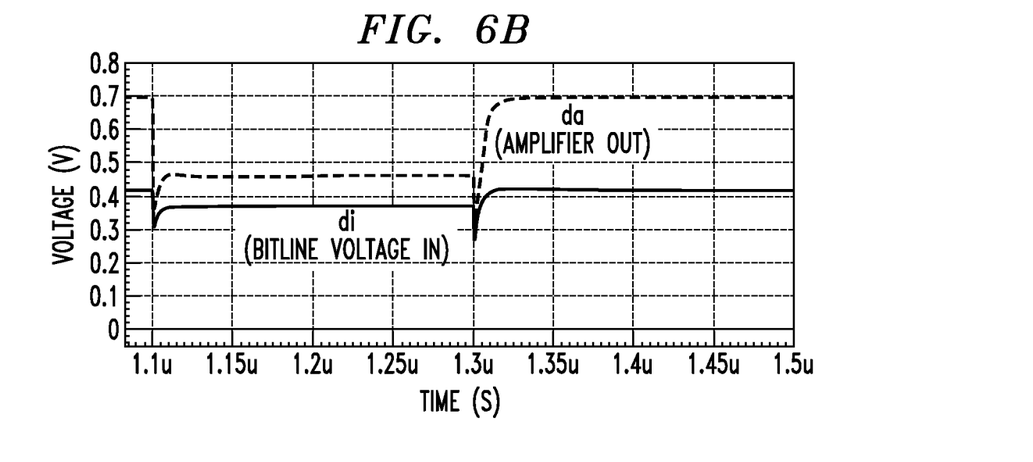
Figure 6C:
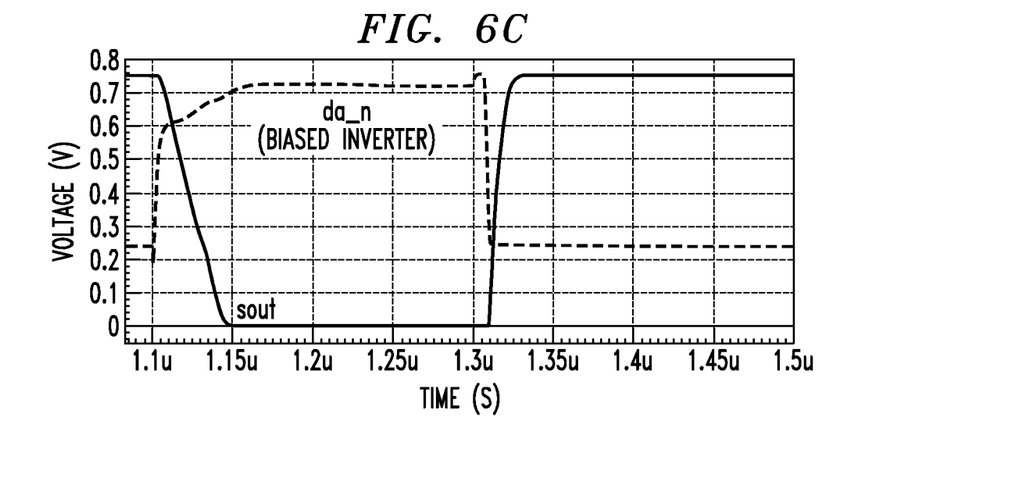

FIG. 6 graphically illustrates the simulated output transient response of current sense amplifier 200 of FIG. 2 at a very low Vcc of 0.75V in a typical 65 nm technology. In particular, for two different events (one at time t=1.1 µsec and another at time t=1.3 µsec), FIG. 6(A) shows the bit-line input current di and the bit line transfer gate voltage waveforms that result from changing the column address to a flash array, FIG. 6(B) shows the input voltage di and the output voltage da of trans-impedance amplifier 220, and FIG. 6(C) shows the output voltage da_n of level-shifted inverter 240 and the rail-to-rail output voltage sout of output buffer 250. In particular, at time t=1.1 µsec, a first column transfer gate is switched on to connect a weakly erased flash bit to di. At time t=1.3 µsec, the first column transfer gate is switched off and a second column transfer gate is switched on to connect a weakly programmed flash bit to di.

For the implementation of FIG. 6, the switching speed of current sense amplifier 200 ranges from less than 10 nsec at Vcc=1.2V to 50 nsec at Vcc=0.75V, while sensing worst-case flash cell currents of 5 µa (for the programmed state) and 10 µa (for the erased state).

SUMMARY

Current sense amplifier 200 of FIG. 2 provides single-ended sensing employing only ground-referenced DC bias inputs, which reduces the noise and supply voltage sensitivity that can occur with supply-referenced biasing.

The current mirror in trans-impedance amplifier 220 employs regenerative gate bias to reduce current roll-off at low power supply voltage.

Current sense amplifier 200 improves tracking between the voltage swing at the output of trans-impedance amplifier 220 and the switch point of the subsequent inverter stage, by level-shifting the inverter ground analogously to the amplifier's level shift.

Current sense amplifier 200 employs native, low-threshold transistors in back-biased configurations to improve headroom without adding leakage.

Within current sense amplifier 200, bias levels are generated by low-power circuitry that compensates for threshold and geometry variations.

Although the present invention has been described in the context of flash memories, the invention can also be implemented in the context of other non-volatile memories, such as ROM, EPROM, and EEPROM.

Although the present invention has been described in the context of current sense amplifiers for use in memories, the present invention can also be implemented in other suitable contexts involving one or more current sense amplifiers. Constrained current/voltage sensing of this sort could apply to applications like alarm system monitoring to detect wiring faults or photo-electric detectors to control lamps or camera flash.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having a current sense amplifier (e.g., 200) comprising:
    a trans-impedance amplifier (e.g., 220) that receives an input current signal (e.g., di) and generates a first voltage signal (e.g., da) based on the input current signal;
    an inverter (e.g., 240) that converts the first voltage signal into an inverted voltage signal (e.g., da_n); and
    an output buffer (e.g., 250) that converts the inverted voltage signal into an output voltage signal (e.g., sout), wherein:

the trans-impedance amplifier comprises a current mirror that generates a bias current for a conversion device (e.g., Icas) that converts the input current signal into the first voltage signal; and the current mirror comprises:
a current source (e.g., Ipbias) that generates a reference current (e.g., Ivd);
a mirror device (e.g., Irdv) connected to the current source to generate the bias current by mirroring the reference current; and
a regenerative device (e.g., Ilowvboost) connected between a drain of the current source and gates of the current source and the mirror device, wherein the regenerative device has a threshold voltage larger than a threshold voltage of the current source.

2. The invention of claim 1, wherein the threshold voltage of the regenerative device is larger than a threshold voltage of the mirror device.

3. The invention of claim 1, wherein the regenerative device provides regenerative feedback within the current mirror.

4. The invention of claim 1, wherein the regenerative device provides gate drive enhancement at power supply levels below a nominal operating voltage.

5. The invention of claim 4, wherein, as the power supply level drops and approaches a threshold voltage of the regenerative device, channel impedance of the regenerative device rises more rapidly than channel impedances of the current source and the mirror device, which increases a drain-to-source drive voltage (e.g., Vds) across the regenerative device, thereby compensating for falling drain bias of the mirror device as its drain-to-source voltage (e.g., Vds) decreases.

6. The invention of claim 4, wherein the regenerative device provides gate overdrive to the current source to counteract drain conductance falloff of the mirror device as the power supply level drops.

7. The invention of claim 1, wherein:
the integrated circuit further comprises a core power supply having a nominal operating voltage; and
the current sense amplifier is adapted to operate properly when the core power supply's voltage is less than the nominal operating voltage.

8. The invention of claim 7, wherein:
the nominal operating voltage of the core power supply is about 1.2V; and
the current sense amplifier is adapted to operate properly when the core power supply's voltage is below 1V.

9. The invention of claim 1, wherein the trans-impedance amplifier further comprises a bleed device (e.g., Ibleed) that prevents the conversion device from shutting off completely.

10. The invention of claim 1, wherein the current sense amplifier further comprises a recharge clamp device (e.g., Iclamp) whose gate is connected to a bias reference voltage (e.g., vcas) in common with a gate of the conversion device.

11. The invention of claim 1, wherein:
the integrated circuit comprises a plurality of instances of the current sense amplifier; and
the integrated circuit further comprises a reference generator (e.g., 300) connected to generate at least one bias reference voltage (e.g., nbias, vcas) for the current sense amplifier, wherein the reference generator is connected to provide, in common, the at least one bias reference voltage to the plurality of instances of the current sense amplifier.

12. The invention of claim 11, wherein the reference generator is further connected to generate a control signal (e.g., sae) for selectively enabling and disabling the current sense amplifier, wherein the reference generator has delay circuitry (e.g., 302) adapted to delay an enabling value for the control signal to allow the at least one bias reference voltage to settle to a steady-state voltage in order to limit in-rush current.

13. The invention of claim 1, wherein:
the integrated circuit is a programmable device having non-volatile memory; and
the current sense amplifier is connected to read configuration data stored in the non-volatile memory to configure the programmable device.

14. An integrated circuit having a current sense amplifier (e.g., 200) comprising:
a trans-impedance amplifier (e.g., 220) that receives an input current signal (e.g., di) and generates a first voltage signal (e.g., da) based on the input current signal, wherein the trans-impedance amplifier has a switching range that varies with supply voltage (e.g., Vcc);
a level-shifted inverter (e.g., 240) that converts the first voltage signal in a first voltage domain (e.g., Vss-to-Vcc) into an inverted voltage signal (e.g., da_n) in a second voltage domain (e.g. com-to-Vcc), different from the first voltage domain, wherein the level-shifted inverter has a voltage switch point that tracks the switching range of the trans-impedance amplifier; and
an output buffer (e.g., 250) that converts the inverted voltage signal into an output voltage signal (e.g., sout).

15. The invention of claim 14, wherein the output buffer converts the inverted voltage signal in the second voltage domain into the output voltage signal in the first voltage domain.

16. The invention of claim 14, wherein the level-shifted inverter comprises:
an inverter (e.g., Ipbi, Inbi) that converts the first voltage signal into the inverted voltage signal; and
level-shifting circuitry (e.g., Ilvl_shift, Icom) connected to raise a low supply of the inverter to a voltage level (e.g., com) above a ground rail of the first voltage domain.

17. The invention of claim 16, wherein the level-shifting circuitry comprises first and second devices (e.g., Ilvl_shift, Icom) connected in series between supply and ground rails of the first voltage domain and having an intermediate node (e.g., com) connected to the low supply of the inverter.

18. The invention of claim 17, wherein voltage at the intermediate node tracks a bias reference voltage (e.g., vcas) applied to the current sense amplifier.

19. The invention of claim 14 including a reference generator (e.g., 300) that generates a bias voltage reference (e.g., nbias) for the current sense amplifier, wherein:
the bias voltage reference is referenced to a ground voltage reference (e.g., Vss); and
the current sense amplifier comprises local bias circuitry (e.g., Ipbias, Ibias) that generates, based on the bias voltage reference, a local bias voltage reference (e.g., pbias) that is referenced to a power supply voltage (e.g., Vcc), wherein the sense amplifier comprises a trans-impedance amplifier (e.g., 220) that converts an input current signal (e.g., di) into a first voltage signal (e.g., da) based on the local bias voltage reference.

20. The invention of claim 14, wherein:
the integrated circuit comprises a plurality of instances of the current sense amplifier connected to receive, in common, the bias voltage reference from the reference generator; and
each instance of the current sense amplifier comprises a corresponding instance of the local bias circuitry that generates a corresponding local bias voltage reference for a corresponding instance of the trans-impedance amplifier.

\* \* \* \* \*